May 29, 1962 J. R. BIARD 3,037,172
DUTY CYCLE MODULATED MULTIVIBRATOR
Filed Sept. 22, 1959
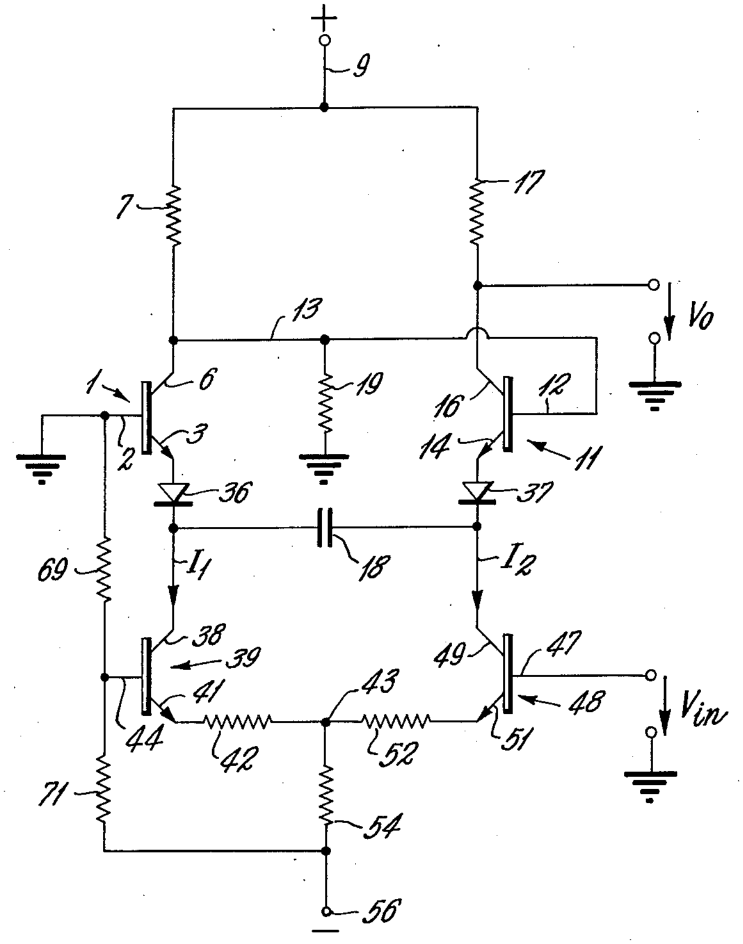
INVENTOR
J. R. Biard
BY Stevens, Davis, Miller & Mosher
ATTORNEYS United States Patent Office 3,037,172

Patented May 29, 1962

3,037,172

DUTY CYCLE MODULATED MULTIVIBRATOR

James R. Biard, Richardson, Tex., assignor to Texas Instruments Incorporated, Dallas, Tex., a corporation of Delaware Filed Sept. 22, 1959, Ser. No. 841,553

1 Claim. (Cl. 332—14)

The present invention relates to multivibrator circuits and more particularly to a multivibrator circuit in which the duty cycle may be varied in accordance with an input signal.

An emitter or cathode-coupled multivibrator circuit is employed as the oscillatory element of the duty cycle modulation circuit of the present invention. In an emitter-coupled multivibrator, a capacitor is connected between the emitter electrodes of two transistors and the base electrode of one transistor is connected to the collector electrode of the other transistor, the other transistor having its base returned to a source of reference potential such as ground. In operation the transistors alternately conduct to generate the oscillations of the circuit. The voltage on the emitter of the transistor which is not conducting is dependent upon the voltage across the capacitor intercoupling the two emitter electrodes, and the charge on this capacitor is continuously changing as a result of the flow of a portion of the current from the conducting transistor. When the voltage on the emitter of the non-conducting transistor reaches that of the base electrode, this transistor starts conducting. Due to regenerative action through the base collector circuit of the two transistors, the previously conducting transistor then stops conducting and the previously non-conducting transistor conducts fully. The charge on the capacitor then starts to change in the opposite direction. This action continues until the charge is sufficiently changed to cause the potential of the emitter electrode of the now non-conducting transistor to equal that of the base electrode, in which case switching again occurs.

The frequency of the circuit is determined by the time of the charging and discharging of the capacitor, and a frequency modulator may be developed by varying the charging or discharging time of the capacitor as a function of an input voltage. Such a circuit forms the subject matter of a co-pending application Serial No. 841,552 filed on September 22, 1959 by Walter T. Matzen entitled, "Frequency Modulated Multivibrator," and assigned to the assignee of the present invention. In the circuit of the co-pending application, the emitter electrode of one transistor is connected to a normally constant current load, which is variable in accordance with an input signal. In this manner, the charging current of the capacitor is made a value which can be varied in accordance with an input signal. As a result of this control of charging current during one state of conduction of the multivibrator, the duration of one complete cycle is variable, and therefore the frequency is variable.

In the circuit described, the duty cycle of the oscillator varies with changes in frequency. The duty cycle can be made constant by making the voltage swing across the capacitor constant and connecting the emitter electrodes of both transistors to constant current loads which are both variable in the same direction in accordance with an input signal. Such a circuit is the subject matter of the co-pending application Serial No. 841,551 filed on September 22, 1959 by James R. Biard entitled, "Frequency Modulated Multivibrator with a Constant Duty Cycle," and assigned to the assignee of the present invention.

According to the circuit of the present invention, the duty cycle is linearly variable in accordance with an input signal. This linear duty cycle modulation is achieved by connecting a differential amplifier to control the discharge currents of the capacitor during both states of conduction of the multivibrator. This differential amplifier provides normally constant current loads for the charging and discharging currents of the capacitor. These normally constant current loads are variable in opposite directions in accordance with an input signal voltage. The circuit has the further advantage that the duty cycle is independent of the voltage swing across the capacitor.

Further objects and advantages of the present invention will become apparent as the following detailed description of a preferred embodiment of the invention unfolds and when taken in conjunction with the single FIGURE of the drawings showing a schematic circuit diagram of the duty cycle modulator of the present invention.

As shown in the drawings, the circuit comprises two NPN transistors 1 and 11. The transistor 1 is provided with an emitter 3, a base 2 and a collector 6. The transistor 11 is provided with an emitter 14, a base 12, and a collector 16. The emitter electrodes 3 and 14 are connected through diodes 36 and 37, respectively, to the terminals of capacitor 18 with the anodes of the diodes 36 and 37 being connected to the emitters. The diodes 36 and 37 serve the function of protecting the emitter-base junctions of the transistors 1 and 11 from excessive reverse voltages. The junction of the diode 36 and capacitor 18 is connected to collector electrode 38 of an NPN transistor 39, which has its emitter electrode 41 connected via a resistor 42 to junction point 43. The junction of the diode 37 and capacitor 18 is connected to collector electrode 49 of transistor 48, which has its emitter electrode 51 connected via a resistor 52 to the junction point 43. The junction point 43 is connected via a resistor 54 to a negative source of potential 56. The base electrode 44 of transistor 39 is connected via a resistor 69 to ground and is connected through a resistor 71 to the negative source 56. The base electrode 47 of the transistor 48 is directly connected to a source of input signal voltage. A source of positive potential 9 is connected to the collector 6 of transistor 1 via a resistor 7 and to the collector 16 of transistor 11 via a resistor 17 to provide the collector voltage for transistors 1 and 11. The base electrode 2 of the transistor 1 is connected directly to ground and the collector electrode 6 is connected directly to the base 12 of the transistor 11 over a conductor 13. A resistor 19 connects the conductor 13 to ground. The output voltage is taken from the collector 16 of the transistor 11.

The operation of the circuit is similar to that of the circuit described in the aforesaid co-pending applications. The transistors 1 and 11 alternately conduct to generate the oscillations of the circuit. When the transistor 1 is conducting, current flows from the source 9 through resistor 7, collector 6, emitter 3, and diode 36 to the junction between capacitor 18 and the collector 38 of transistor 39. The current divides at this junction with a portion flowing to the capacitor 18 and the remainder flowing to the collector 38 of transistor 39. The current flowing to the capacitor 18 causes an equal current to flow out from the other side of capacitor 18 to the collector 49 of transistor 48. At this point in the cycle, the capacitor 18 will be charged in such a direction that the current flowing into and out of the capacitor 18 discharges the capacitor 18. Because of the voltage drop through the resistor 7, the collector 6 of transistor 1 will be at a relatively low potential, which is applied to the base 12 of the transistor 11. The emitter 14 of the transistor 11 will be more positive than the base 12 due to the voltage across the charged capacitor 18, and thus the transistor 11 will be maintained in a non-conducting state during this part of the cycle. The capacitor 18 will continue to discharge in this manner until the potential at the emitter 14 of transistor 11 reaches that of the base 12, thus causing the transistor 11 to start conducting. The current from the emitter 14 of transistor 11 opposes that part of the current flowing from the emitter 3 of transistor 1 into the capacitor 18. Therefore, when the transistor 11 starts conducting, it causes a rise in the potential of the collector 6 of transistor 1. This rise in potential is applied to base 12 of the transistor 11 causing an increase in the current flowing through transistor 11 further decreasing the current flow through transistor 1. Thus, the action is cumulative and the transistor 11 is quickly switched into a fully conducting condition and the transistor 1 is switched to a fully non-conducting condition. The current now flows from the source 9 through resistor 17, the transistor 11, and the diode 37 and divides, a portion flowing into the capacitor 18 and the remainder flowing to the collector 49 of transistor 48. The current flowing into the capacitor 18 causes an equal current to flow out of the other side of capacitor 18 to the collector 38 of transistor 39. This current flowing into and out of capacitor 18 causes the capacitor 18 to recharge. As the capacitor 18 recharges, the voltage across it increases and this action causes a decrease in the potential at the emitter 3 of the transistor 1. The charging of capacitor 18 continues until the potential at the emitter 3 of transistor 1 reaches the potential of the base 2, at which time the transistor 1 begins again to conduct. When the transistor 1 starts to conduct, the potential at the collector 6 drops. This drop in potential is applied to the base 12 of transistor 11 causing the current through transistor 11 to decrease. This action causes the emitter potential of the transistor 11 to fall. This drop in potential is applied to the emitter 3 of transistor 1 by the capacitor 18 causing an increase in the current through transistor 1. Thus the action is cumulative and the transistor 1 is switched quickly to a fully conducting condition and the transistor 11 is switched quickly to a fully non-conducting condition. A portion of the current flowing through transistor 1 again starts to discharge the capacitor 18 and the cycle repeats itself ad infinitum.

The transistors 39 and 48 provide normally constant current loads for the charging and discharging currents from the capacitor 18 and the currents from the emitters 3 and 14 of the transistors 1 and 11. The magnitudes of the normally constant currents flowing through the transistors 39 and 48 are differentially variable in accordance with an input signal voltage applied to the base 47 of the transistor 48. When the signal applied to the base 47 is increased, the current flowing through the transistor 48 will be increased. At the same time, as a result of the circuit coupling the emitters 41 and 51 of the transistors 39 and 48, the current flowing through the transistor 39 will be decreased. As a result, the duty cycle will be altered so that the duration of that portion of the cycle in which the transistor 1 is conducting will be decreased and the duration of that portion of the cycle in which the transistor 11 is conducting will be increased. Conversely, when the signal voltage applied to the base 47 of the transistor 48 is decreased, the current flowing through the transistor 48 will decrease and the current flowing through the transistor 39 will increase. This action will alter the duty cycle of the device in the opposite direction so that the duration of that part of the cycle in which the transistor 1 is conducting will be increased and the duration of that part of the cycle in which the transistor 11 is conducting will be decreased.

Since the transistor 48 provides a constant current load for the discharging current of the capacitor 18, the duration of that part of the cycle in which the transistor 1 is conducting and the capacitor 18 is discharging will be directly proportional to the value of the constant current flowing through transistor 48. Likewise, since the transistor 39 provides a constant current load to the charging current of capacitor 18, the duration of that part of the cycle in which transistor 11 conducts and the capacitor 18 charges will be directly proportional to the value of the current flowing through transistor 39. The transistors 39 and 48 are selected and adjusted so that they are linearly related to the input signal voltage by multiplication factors having the same absolute value, one being positive and the toher being negative because of the differential action. Therefore, the two parts of the cycle, one when the transistor 1 conducts and the other when the transistor 11 conducts, are both linearly related to the input signal voltage by multiplication factors having the same absolute value. The duty cycle will therefore be linearly related to the input signal voltage. This relationship can best be understood from the equation for the duty cycle, which is as follows:

$$D=\frac{t_1}{t_1+t_2} \tag{1}$$

In this equation D is the duty cycle, $t_1$ is the duration of that part of the cycle in which transistor 1 conducts, and $t_2$ is the duration of that part of the cycle in which transistor 11 conducts. The equation for the times $t_1$ and $t_2$ are as follows:

$$t_1=\frac{CV}{I_1}\ t_2=\frac{CV}{I_2} \tag{2}$$

In these equations C is the capacitance of capacitor 18, V is the voltage swing across capacitor 18, $I_1$ is the curthrough transistor 39 and $I_2$ is the current through transistor 48. If Equations 1 and 2 are combined the following equation is determined for the duty cycle.

$$D=\frac{I_2}{I_1+I_2} \tag{3}$$

Since the currents $I_1$ and $I_2$ are linearly related to the input signal voltage by the same factor in absolute value, the equations for $I_1$ and $I_2$ are as follows:

$$I_1=I_0-KV_{\text{in}}\ \text{-}\ I_2=I_0+KV_{\text{in}} \tag{4}$$

In these equations $I_0$ is a constant, K is a constant, and $V_{in}$ is the input signal voltage. Substitution of the values of Equations 4 into Equation 3 provides the following equation for the duty cycle:

$$D=\frac{I_0+KV_{\text{in}}}{2I_0} \tag{5}$$

Thus, the duty cycle is linearly related to the input signal voltage $V_{in}$ and is independent of the swing voltage V across capacitor 18.

The preferred embodiment of the invention as described above makes use of transistors as the active circuit elements. The invention is also applicable to multivibrators in which vacuum tubes or other equivalents of the transistor are used as the active circuit elements. Many modifications may be made to the above described preferred embodiment of the invention without departing from the spirit and scope of the invention, which is limited only as defined in the appended claim.

What is claimed is:

A multivabrator circuit comprising first and second transistors each having a base, an emitter and a collector, a voltage supply having first and second terminals, a pair of load resistors connecting the collectors of said transistors separately to said first terminal, said collector of said first transistor being directly connected to said base of said second transistor, the base of said first transistor being connected to a point of reference potential, a capacitor connected between the emitters of said first and second transistors, a differential amplifier including a pair of amplifying devices each having input, output and common electrodes, the output electrodes of said amplifying devices being connected separately to the emitters of said transistors, the common electrodes of said amplifying devices being connected through a common impedance element to said second terminal, resistance means connected between said second terminal and said point of reference potential an intermediate point on said resistance means being connected to the input electrode of one of said amplifying devices whereby said input electrode will be biased at a given point, and means for applying an input voltage to the input electrode of the other of said amplifying devices, said differential amplifier including said amplifying devices providing a pair of voltage-responsive differentially-variable constant current sources whereby constant-frequency variable-duty-cycle operation of said multivibrator circuit is provided.

References Cited in the file of this patent

UNITED STATES PATENTS

| | | |
|---|---|---|
| 2,750,502 | Gray | June 12, 1956 |
| 2,894,215 | Toy | July 7, 1959 |
| 2,929,030 | Wier | Mar. 15, 1960 |